(12) United States Patent
Pommer et al.

(10) Patent No.: US 6,489,184 B1
(45) Date of Patent: Dec. 3, 2002

(54) REMOVING INHERENT STRESS VIA HIGH TEMPERATURE ANNEALING

(75) Inventors: Richard Pommer, Trabuco Canyon, CA (US); Glen Roeters, Huntington Beach, CA (US); Jim Yardley, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/552,808

(22) Filed: Apr. 20, 2000

Related U.S. Application Data

(63) Continuation-in-part of application No. 09/369,037, filed on Aug. 4, 1999, now Pat. No. 6,191,288.

(51) Int. Cl.[7] ............................................... H01L 21/44
(52) U.S. Cl. .................................... 438/125; 204/192.12
(58) Field of Search ....................... 204/192.12; 438/125

(56) References Cited

U.S. PATENT DOCUMENTS

| | | | |
|---|---|---|---|
| 3,452,133 A | 6/1969 | Bratton et al. ............... 264/346 |
| 3,988,408 A | 10/1976 | Haining et al. .............. 264/156 |
| 4,115,185 A | 9/1978 | Carlson et al. .............. 156/659 |
| 4,569,885 A | 2/1986 | Yamaguchi et al. ......... 428/339 |
| 4,648,179 A | * 3/1987 | Bhattacharyya et al. ...... 29/832 |
| 4,725,484 A | 2/1988 | Kamagawa et al. ......... 428/220 |
| 4,874,721 A | * 10/1989 | Kimura et al. ............... 438/125 |
| 5,287,619 A | * 2/1994 | Smith et al. ................... 29/852 |
| 5,297,956 A | * 3/1994 | Yamabe et al. ................ 432/11 |
| 5,837,619 A | * 11/1998 | Adachi et al. ............... 438/795 |

FOREIGN PATENT DOCUMENTS

| | | |
|---|---|---|
| EP | 0 196 874 A2 | 8/1986 |
| JP | 04007130 | 10/1992 |

OTHER PUBLICATIONS

Harper, Electronic packaging and Interconnection Handbook, (McGraw–Hill, New York, 1997), pp. 1.56–1.57.*

* cited by examiner

Primary Examiner—Richard Elms
Assistant Examiner—Christian D. Wilson
(74) Attorney, Agent, or Firm—Rutan & Tucker, LLP; David J. Zoeteway; Robert D. Fish

(57) ABSTRACT

Methods and apparatus are provided which decrease the amount of movement likely to occur during processing of a substrate. In particular, a horizontally supported dielectric panel is subjected to a series of processing steps during which the panel is heated, cooled, or maintained at a fixed temperature so as to a achieve a 2 to 1 reduction in material movement during subsequent processing. It is contemplated that application of the disclosed methods to a dielectric panel will be particularly beneficial when application is accomplished prior to laser drilling and sputtering the panel.

12 Claims, 2 Drawing Sheets

---

10
providing a first panel of dielectric material

20
reducing external stresses being applied to the panel

30
raising the temperature of the panel to a level and for a length of time sufficient to decrease the inherent stress of the panel

40
laser drilling through holes/vias in the panel

50
sputtering a conductive material onto the panel

60
imaging

70
laminating the panel to other panels to form a multi-layer device

| 10 |
| --- |
| providing a first panel of dielectric material |

| 20 |
| --- |
| reducing external stresses being applied to the panel |

| 30 |
| --- |
| raising the temperature of the panel to a level and for a length of time sufficient to decrease the inherent stress of the panel |

| 40 |
| --- |
| laser drilling through holes/vias in the panel |

| 50 |
| --- |
| sputtering a conductive material onto the panel |

| 60 |
| --- |
| imaging |

| 70 |
| --- |
| laminating the panel to other panels to form a multi-layer device |

FIG. 1

REMOVING INHERENT STRESS VIA HIGH TEMPERATURE ANNEALING

This is a continuation-in-part of U.S. application Ser. No. 09/369,037, filed Aug. 4, 1999, now allowed as U.S. Pat. No 6,191,288.

FIELD OF THE INVENTION

The field of the invention is substrate processing.

BACKGROUND OF THE INVENTION

When subjecting thin polymer substrates used in the fabrication of IC packages, printed circuit boards, and multi-chip modules to processing steps which raise the temperature of the substrates movement of the substrate material will frequently occur. Such movement can cause difficulty in positioning and aligning of components during processing.

As an example, in a polyimide film substrate having lased vias, the position of the vias may change when the film undergoes increases in temperature. Such increases and resultant changes are likely to occur when a conductive material is sputtered onto the film. Thus, particularly in regard to dielectric materials, which are to be subjected to sputtering and/or lamination, there is an ongoing need to improve processing to reduce the amount of material movement, which occurs during processing.

SUMMARY OF THE INVENTION

Methods and apparatus are provided which decrease the amount of movement likely to occur during processing of a substrate. In particular, a horizontally supported dielectric panel is subjected to a series of processing steps during which the panel is heated, cooled, or maintained at a fixed temperature so as to achieve a 2 to 1 reduction in material movement during subsequent processing. It is contemplated that application of the disclosed methods will be particularly beneficial when application is accomplished prior to laser drilling, sputtering, and laminating a substrate.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a diagram of a first method embodying the invention.

DETAILED DESCRIPTION

Referring first to FIG. 1, a method for processing a substrate comprises: step 10, providing a first panel of dielectric material; step 20, reducing external stresses being applied to the panel; step 30, raising the temperature of the panel to a level and for a length of time sufficient to decrease the inherent stress of the panel; step 40, laser drilling through holes/vias in the panel; and step 50, sputtering a conductive material onto the panel; step 60, imaging, and step 70, laminating the panel to other panels to form a multi-layer device.

Step 10, providing a first panel of dielectric material preferably involves obtaining a roll of dielectric film and cutting the material into panels. Although rectangular panels are currently preferred, and panel shape or size may be used so long as subsequent steps can still be accomplished.

Figure 2:
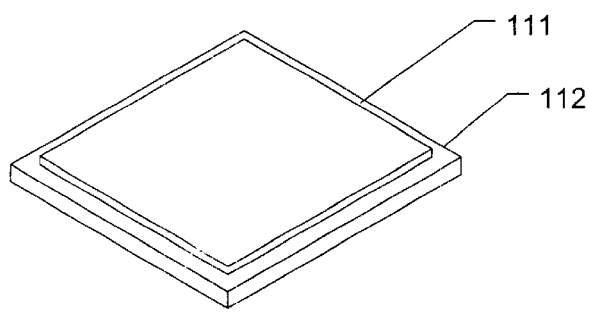
FIG. 2 is a perspective view of a substrate panel being supported by a glass ceramic plate.
Figure 3:
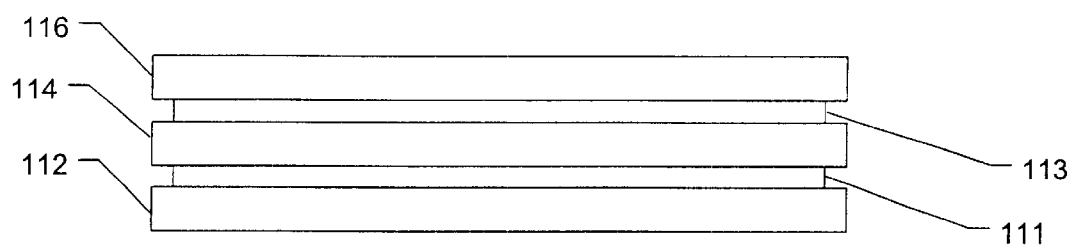
FIG. 3 is a perspective view of a stack of substrate panels with each panel being sandwiched between glass ceramic plates.
Figure 4:
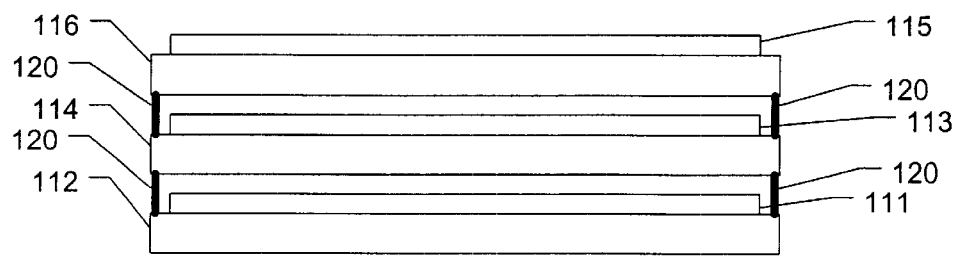
FIG. 4 is a perspective view of a stack of substrate panels stacked in a manner providing separation between panel and plate combinations.

Step 20, reducing the external stresses being applied to the substrate preferably comprises (referring to FIGS. 2–4) supporting the first panel 111 by placing it on top of a first substantially planar and horizontal supporting surface 112. This can be accomplished by laying the dielectric panel 111 on a glass-ceramic plate 112. Glass-ceramic provides a distinct advantage over other materials as a result of a its having a low coefficient of thermal expansion. Low thermal expansion allows it to be subjected to very high temperatures without causing distortion or changes to a substrate (e.g. polyimide film) which is in direct contact with the glass-ceramic surface. It is contemplated that supporting surfaces having a thermal coefficient of expansion which is less than or equal to X parts per million per degree Celsius (ppm/° C.) wherein X is one of 17.5, 17, 12, 6.5, and 6 may be advantageously used. Another advantage of glass-ceramic is that it is able to withstand the severe temperature profile from hot to cold that is required in this process. It is contemplated that desirable supporting surfaces will be capable of withstanding temperatures between 100 and 400 degrees Celsius for a time period between one and twenty four hours. It is also contemplated that in less preferred embodiments the supporting surface may not be planar, may not be horizontal, may have a different coefficient of thermal expansion, may not withstand the temperature profiles described, and/or may not be made of glass-ceramic.

It is contemplated that the disclosed methods may be applied to simultaneously processing multiple panels. In such embodiments, several panels 111, 113, and 115 may be provided with each panel being supported by a glass-ceramic plate 112, 114, 116, 118 with the glass-ceramic plates being stacked on top of one another to form a stack 100 of panels and plates. Although it is preferred that one panel be placed on each plate, alternative embodiments may utilize larger plates or smaller panels such that more than one panel is placed on each plate. In stacking the plates, each of the larger sides of the panels may be in contact with a plate such that a pair of plates sandwiches all or substantially all of the panels. Alternatively, additional supports 120 may be provided such that a gap exists between a panel and any adjacent glass plate not providing support to the panel.

Step 30, raising the temperature of the panel/stack of panels comprises subjecting the stack of panels to a high temperature anneal cycle, the cycle comprising a series of processing segments wherein each segment comprises placing the stack of panels in an inert gas filled chamber for a fixed duration, with the gas having a temperature which is either maintained within a fixed range for the duration or which is adjusted upward or downward to a target temperature during the duration.

In preferred embodiments the panel(s) are placed in an oven containing a nitrogen atmosphere and subjected to the following: ramping the temperature of the gas up from an ambient/room temperature to 150° C. over a period of 5 minutes; dwelling at 150° C. for 60 minutes; ramping up to 375° C. over a period less than or equal to 30 minutes; dwelling at 375° C. for 4 hours; ramping down to 100° C.

or less, and subsequently removing the panel(s) from the oven once the oven and/or the panels of cooled down to a temperature less than or equal to 100° C. Use of the previous times and temperatures is believed to result in a 2:1 reduction in material movement.

It is contemplated that variations in time and temperature of processing segments may have a significant impact on the amount of reduction in material movement to be obtained. However, it is contemplated a panel's inherent stress can be reduced by any method which provides adequate support (i.e. support with minimal stress) during heating and which heats the substrate to a temperature at which the material softens. The actual temperature and time required will vary depending on the composition of the panels, but are contemplated as likely being between 100 and 400 degrees Celsius and between 1 and 24 hours.

As indicated by steps 40–70, the methods disclosed herein are considered to be particularly advantageous when subjected to subsequent drilling, sputtering, imaging and/or lamination steps.

Thus, specific embodiments and applications of dielectric processing have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. Method of substrate preparation comprising:
   providing a plurality of substrate panels;
   providing a plurality of separation plates having a coefficient of thermal expansion less than or equal to 6.5 ppm/° C.;
   stacking the panels and plates together and subjecting the stack to a series of heating and cooling steps wherein the temperature of the stack is raised to at least 370 degrees for at least 3.5 hours, during the series of heating and cooling steps.

2. The method of claim 1 wherein at least a portion of the series of heating and cooling steps is performed while the stack is in an infrared convection oven.

3. Method of substrate preparation comprising:
   providing a stack of dielectric material panels;
   reducing external stresses being applied to each panel of the stack of panels by supporting each panel of the stack of panels by placing it on top of a first substantially planar and horizontal supporting surface wherein the supporting surface
      has a coefficient of thermal expansion which is less than or equal to X ppm/° C. wherein X is one of 17, 12, and 6,
      can withstand a temperature of at least D degrees Celsius over a time period of at least T hours without being damaged where D is 400 and T is 24,
      comprises a glass ceramic plate; and
   raising the temperature of the stack of panels to a level and for a length of time sufficient to decrease the inherent stress of each panel of the stack of panels, wherein the step of raising the temperature of the stack of panels comprises subjecting the stack of panels to a high temperature anneal cycle, wherein the cycle
      comprises a series of processing segments wherein each segment comprises placing the stack of panels in a gas filled chamber for a fixed duration, with the gas having a temperature which is either maintained within a fixed range for the duration or which is adjusted upward or downward to a target temperature during the duration, and
      comprises the following segments in the following order:
         ramping the temperature of the gas up from an ambient/room temperature to 150° C. over a period of 5 minutes;
         dwelling at 150° C. for 60 minutes;
         ramping up to 375° C. over a period less than or equal to 30 minutes;
         dwelling at 375° C. for 4 hours;
         ramping down to 100° C. or less.

4. Method of substrate preparation wherein a substrate panel is placed in contact with a heat source and the heat source is subjected to a heating sequence comprising the following segments in the following order:
   ramping the temperature of the heat source from an ambient/room temperature to 150° C. over a period of 5 minutes;
   dwelling at 150° C. for 60 minutes;
   ramping up to 375° C. over a period less than or equal to 30 minutes;
   dwelling at 375° C. for 4 hours;
   ramping down to 100° C. or less.

5. The method of claim 4 wherein the heat source is nitrogen gas and the dielectric material comprises of a polyimide or polyimer film.

6. The method of claim 5 wherein the heat source is contained in an infrared convection oven.

7. The method of claim 6 further comprising laser drilling through holes in the panel and sputtering a conductive material onto the panel after the heating sequence is complete.

8. Method of substrate preparation comprising:
   providing a first panel of dielectric material;
   supporting the first panel by placing it on top of a first substantially planar and horizontal supporting surface having a coefficient of thermal expansion which is less than or equal to X ppm/° C. wherein X is 17;
   while preventing contact between the first panel and any solid object other than the first supporting surface, raising the temperature of the first panel by placing it in contact with a heated gas to a level and for a length of time sufficient to decrease the inherent stress of the panel; and
   removing the panel of dielectric material from the supporting surface after decreasing the inherent stress of the panel.

9. The method of claim 8 further comprising:
   providing a second panel of dielectric material;
   supporting the second panel by placing it on top of a second substantially planar and horizontal supporting surface positioned above the first panel and first supporting surface, the second supporting surface having a coefficient of thermal expansion which is less than or equal to X ppm/° C. wherein X is 17;

while preventing contact between the second panel and any solid object other than the second supporting surface, simultaneously raising the temperature of both the first and second panels by placing them in contact with a heated gas to a level and for a length of time sufficient to decrease the inherent stress of both the first and second panels; and removing the first and second panels of dielectric material from the supporting surfaces after decreasing the inherent stress of the panels.

10. The method of claim 9 wherein X is one of 12 and 6.

11. The method of claim 10 wherein the first and second supporting surfaces can withstand a temperature of at least D degrees Celsius over a time period of at least T hours without being damaged where D is 400 and T is 24.

12. The method of claim 11 wherein each of the first and second supporting surfaces comprises a glass-ceramic plate.

* * * * *